(12) United States Patent
Patana (10) Patent No.: US 6,600,378 B1
(45) Date of Patent: Jul. 29, 2003

(54) FRACTIONAL-N FREQUENCY SYNTHESIZER WITH SINE WAVE GENERATOR

(75) Inventor: Jari Petri Patana, Vantaa (FI)

(73) Assignee: Nokia Corporation, Espoo (FI)

( * ) Notice: Subject to any disclaimer, the term of this patent is extended or adjusted under 35 U.S.C. 154(b) by 21 days.

(21) Appl. No.: 10/053,250

(22) Filed: Jan. 18, 2002

(51) Int. Cl.$^7$ ................................ H03L 7/00
(52) U.S. Cl. ............. 331/1 A; 331/17; 327/156; 377/47; 341/143
(58) Field of Search .............. 331/1 A, 17, 25; 327/156; 377/47, 48; 341/143

(56) References Cited

U.S. PATENT DOCUMENTS

| | | | |
|---|---|---|---|
| 4,179,670 A | * 12/1979 | Kingsbury | ............. 331/10 |
| 5,495,206 A | 2/1996 | Hietala | |
| 5,872,487 A | 2/1999 | Adachi et al. | |
| 5,903,194 A | * 5/1999 | Opsahl et al. | ............. 331/1 A |
| 6,060,950 A | 5/2000 | Groe | |
| 6,515,553 B1 | * 2/2003 | Filiol et al. | ............. 332/127 |

* cited by examiner

*Primary Examiner*—Henry Choe
(74) *Attorney, Agent, or Firm*—Ware, Fressola, Van Der Sluys & Adolphson, LLP (57) ABSTRACT

A fractional-N frequency synthesizer is disclosed wherein the multi-modulus frequency divider in the feedback path of the phase locked loop is controlled by a delta-sigma modulator to achieve the desired division ratio. The fractional input control signal to the delta sigma modulator is dither to break any periodicity in the modulator output signal to avoid the generation of fractional spurious frequencies.

20 Claims, 6 Drawing Sheets

FRACTIONAL-N FREQUENCY SYNTHESIZER WITH SINE WAVE GENERATOR

TECHNICAL FIELD

The present invention relates generally to delta-sigma modulator based fractional-N phase locked loop frequency synthesizers and deals more particularly with a delta-sigma modulator based fractional-N phase locked loop frequency synthesizer with a sine wave generator to break the periodicity of the delta-sigma modulator output to eliminate the generation of fractional spurious frequencies.

BACKGROUND OF THE INVENTION

Digital frequency synthesizers have long been used in communication systems, particularly RF communication systems, to generate RF signals carried over RF channels. In frequency synthesis, it is desirable to achieve the selected frequency output in as little time as possible with any spurious outputs minimized. It is known to create a frequency synthesizer by placing a frequency divider function between the voltage-controlled oscillator (VCO) output and the phase frequency detector (PFD) in a phase-locked loop (PLL), wherein the output is an integer-N multiple of the input reference frequency to the PFD. The spurious outputs in question are usually associated with phase detectors and occur at the phase detector operating frequency, which is generally the same as the channel spacing. Incorporating a fractional-N division function in the PLL helps overcome problems of spurious frequency outputs in an integer PLL by allowing the phase detector to operate at a much higher frequency for the same channel spacing.

A number of methods that are based upon the concept of integer-N frequency synthesis are known to realize the fractional-N division function and include pulse swallowing, phase interpolation, Wheatly random jittering and delta-sigma modulation to control the multi-modulus, including dual-modulus, frequency dividers to provide the division function. Of the known methods, a delta-sigma modulator realization of a fractional-N frequency synthesizer is desirable and preferable to achieve low phase noise, fast settling time, fine channel resolution and wide tuning bandwidth. The delta-sigma modulator fractional-N phase locked loop frequency synthesizer is based on the concept of division ratio averaging, wherein an integer frequency divider rather than a fractional frequency divider is used, and the division ratio is dynamically switched between two or more values, effectively providing a non-integer number division function. One of the more important advantages of using the delta-sigma modulator to control a multi-modulus is the ability to shape phase noise introduced by the delta-sigma modulator controlled fractional-N division function. A problem generally associated with such a deltasigma modulator fractional-N frequency synthesizer is the appearance or presence of fractional spurious levels at a fractional offset frequency. The fractional spurious levels may also appear at the fractional offset frequency harmonics. The fractional spurious levels in delta-sigma modulator based fractional-N frequency synthesizers may originate from several sources including the operation of the delta-sigma modulator itself, coupling between the multi-modulus prescaler or charge pump driving the loop filter and the outside world through power supply feeds or substrates, and the nonlinearity of the charge pump. The fractional spurious frequencies may also originate from the spacing error or timing error of the multimodulus prescaler.

It is a general object therefore of the present invention to provide a method and related apparatus to prevent the generation of spurious frequency errors in a delta-sigma based fractional-N frequency synthesizer.

It is another object of the present invention to break the periodicity of the multi-modulus control output signal of the delta-sigma modulator to eliminate fractional spurious frequencies in the fractional-N frequency synthesizer originating from the operation of the delta-sigma modulator.

It is a further object of the present invention to provide a delta-sigma based fractional-N phase locked loop frequency synthesizer with a sine wave generator to break the periodicity of the output signal of the delta-sigma modulator to eliminate the production of fractional spurious frequencies.

Other objects and features of the present invention will become readily apparent from the following written detailed description taken together with the drawings forming a part thereof.

SUMMARY OF THE INVENTION

The invention resides in a fractional-N frequency synthesizer having a delta-sigma modulator control of the division ratio of a multi-modulus frequency divider in the feedback path of the phase locked loop. The output control signal of the delta-sigma modulator is dithered to break the periodicity of the division ratio control signal which occurs when the fractional control input words to the delta-sigma modulation has too few "zeros" or "ones" which cause the generation of fractional spurious frequencies. The invention avoids the generation of the fractional spurious frequencies.

In a one aspect of the invention, a delta-sigma fractional-N frequency synthesizer comprises a phase locked loop including a phase frequency detector, a loop filter, a voltage-controlled oscillator and a multi-modulus frequency divider in a feedback loop between the voltage-controlled oscillator output and an input of the phase frequency detector. The delta-sigma modulator has an input for receiving a fractional control word and an output coupled to the multi-modulus frequency divider for controlling the division ratio of the multi-modulus frequency divider in response to the input fractional control word. A generator produces a signal in accordance with and related to a frequency compensation loop error signal from the multi-modulus frequency divider. Means are provided for adding the generator signal output to the fractional input control word to produce a zero average dither fractional control word as the input to the delta-sigma modulator. The delta sigma modulator generates a multi-modulus input control signal whereby the division ratio is changed without generation of fractional spurious frequencies.

Preferably, the order of the delta-sigma modulator has an integer value in the range of Z to X, where Z is an integer value of at least 2 and X has an arbitrary integer value greater than Z.

Preferably, the generator output signal frequency has a value in the range of $F_{comp}/Z$ to $F_{comp}/Y$, where Z is an integer value of at least 2 and the maximum value of Y is related to the loop filter and the frequency compensation loop error signal.

Preferably, the generator signal output is an asymmetrical signal.

Preferably, the generator signal output is a symmetrical signal.

Preferably, the generator is a symmetrical sine wave generator.

Preferably, the generator is an asymmetrical sine wave generator.

Preferably, $F_{comp}/Z$ is equal to 4.

Preferably, $F_{comp}/Z$ is equal to 8.

Preferably, $F_{comp}/Z$ is equal to 16.

Preferably, $F_{comp}/Z$ has an arbitrary integer value equal to or greater than 1.

Preferably, the multi-modulus frequency divider is a dual-modulus frequency divider.

In a further aspect of the invention, the dual-modulus frequency divider includes a prescaler coupled to the output of the voltage-controlled oscillator and includes an N-divider and A-divider coupled to the output of the prescaler. The prescaler has a division ratio control input coupled to the A-divider to switch the division ratio in response to the A-divider completing a predetermined count.

In another aspect of the invention, the fractional input control word further comprises a separate $F_{input}$ control signal and an $M_{input}$ control signal. Means are provided for combining the $F_{input}$ control signal and the generator signal output to produce a delta-sigma modulator input control word. The delta-sigma modulator generates an output control word in response to the input control word. Means are also provided for combining the $M_{input}$ control signal and the delta-sigma modulator output control word to generate the multi-modulus frequency divider division ratio control.

Preferably, the multi-modulus frequency divider further comprises a dual multi-modulus frequency divider.

In a further aspect of the invention, the fractional input control word further comprises a separate $F_{input}$ control signal and an $A_{input}$ control signal and an $N_{input}$ control signal. Means are provided for combining the $F_{input}$ control signal and the generator signal output to produce a delta-sigma modulator input control word. The delta-sigma modulator generates an output control word in response to the input control word. Means are provided for combining the $A_{input}$ control signal and the delta-sigma modulator output control word to generate a multi-modulus "A"control input signal. Means are also provided for combining the $N_{input}$ control signal and the result of the combined $A_{input}$ control signal and delta-sigma modulator output control word to generate a multi-modulus "N" control input signal.

DETAILED DESCRIPTION OF PREFERRED EMBODIMENTS

Figure 1:
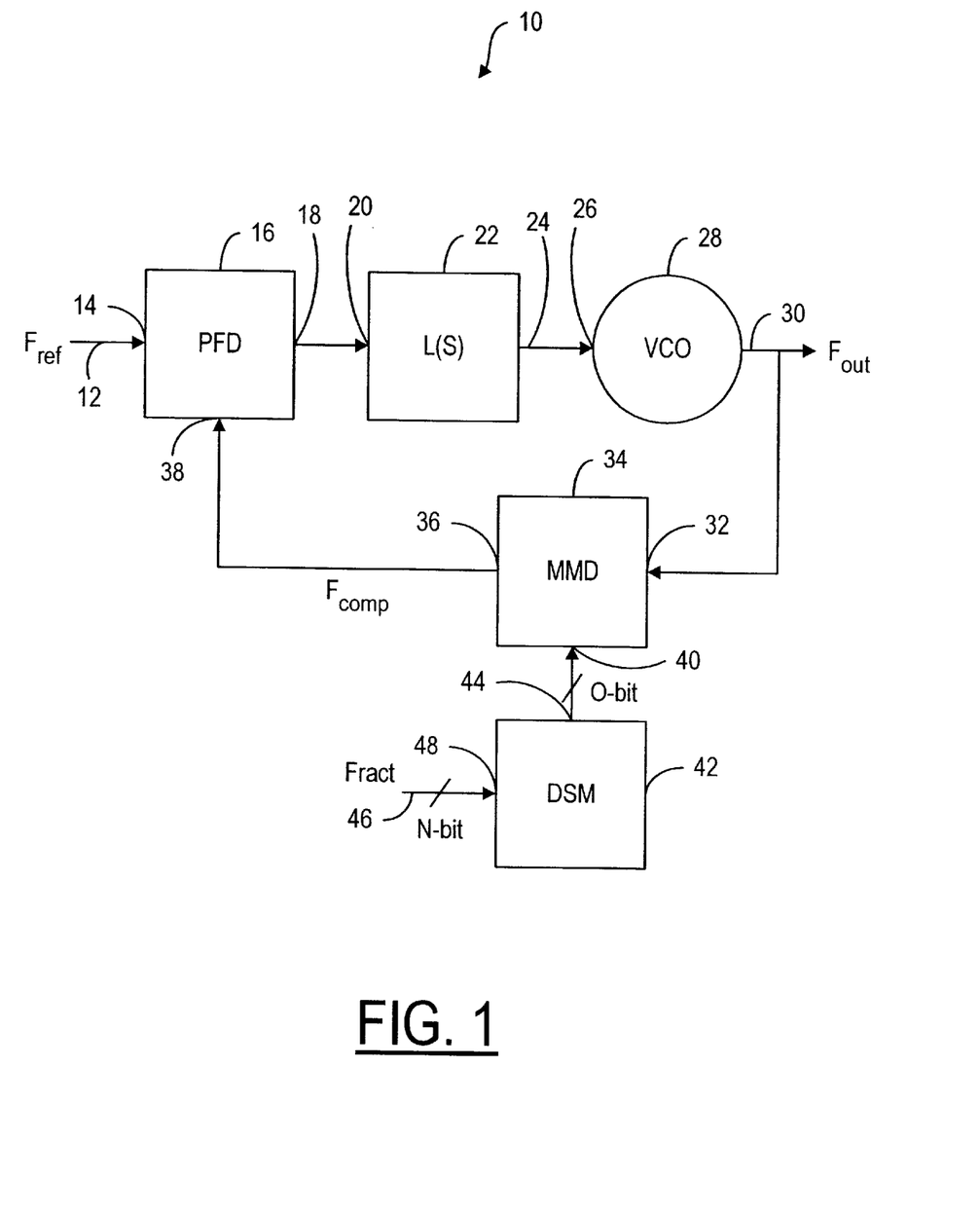
FIG. 1 is a schematic functional block diagram of a delta-sigma modulator based fractional-N synthesizer.

Turning now to the drawings and first considering FIG. 1, a schematic functional block diagram of a representative delta-sigma modulator based fractional-N phase locked loop frequency synthesizer is illustrated therein and generally designated 10. The delta-sigma fractional-N frequency synthesizer 10 comprises a phase frequency detector (PFD) 16, a loop filter 22, and a voltage-controlled oscillator (VCO) 28. A reference frequency $F_{ref}$ at the input 12 to the frequency synthesizer 10 is applied to the input 14 of the PFD 16. A multi-modulus frequency divider 34 is located in the feedback loop between the VCO output 30 and an input 38 of the PFD 16. The output 18 of the PFD 16 is coupled to the input 20 of the loop filter 22. The loop filter 22 functionally operates as an integrating capacitor. The output 24 of the loop filter 22 is coupled to the VCO input 26. The VCO 28 generates a frequency signal $F_{out}$ at the VCO output 30 in response to the signal at its input 26. The frequency $F_{out}$ at the VCO output 30 is coupled to the input 32 of the multi-modulus frequency divider (MMD) 34. The multi-modulus frequency divider 34 is also coupled to and controlled by a delta-sigma modulator (DSM) designated generally 42. The control output 44 of the DSM 42 is coupled to the control input 40 of the MMD 34. The output 36 of the multi-modulus frequency divider 34 is connected to the input 38 of the PFD 16. The signal $F_{comp}$ at the input 38 to the PFD 16 is representative of the loop phase error, that is, the difference in phase between the frequency $F_{out}$ and the input frequency $F_{ref}$. The output signal $F_{comp}$ from the MMD 34 is the phase of the VCO output signal $F_{out}$ divided by the fractional divider or multi-modulus divider division factor M ($F_{comp}=F_{out}/M$) which is controlled by the DSM 42. The difference in phase between the frequency $F_{comp}$ and frequency $F_{ref}$ is produced in the output 18 of the PFD 16. In actuality, the output signal 38 of MMD 34 is a clock signal and the PDF 16 measures the difference between the rising edge of the $F_{comp}$ signal and the rising edge of the $F_{ref}$ signal. Also, the phase difference can be produced using the falling clock edge of the $F_{comp}$ and $F_{ref}$ signals. The PFD 16 is commonly shown in the art as two separate function blocks: a phase detector (PD) and a charge pump (CP) and the reader is referred to text books, literature, data sheets and other information readily available for further explanation of the PFD operation. The PFD 16 measures the phase difference and adjusts (advances or retards) the phase of the VCO 28 and thus the frequency $F_{out}$ produced by the VCO. The frequency $F_{out}$ at the VCO output 30 is related to the input reference frequency $F_{ref}$ by a scaling factor as determined by the MMD 34.

The frequency $F_{out}$ at the VCO output 30 is a fraction of the input reference frequency $F_{ref}$. Since the MMD 34 in actuality is not dividing by a fractional division ratio, but rather an integer value, the fractional-N frequency synthesis is achieved through division ratio averaging, that is, the division ratio is dynamically switched between two or more values, effectively causing the divider to divide by a non-integer number. In FIG. 1, the DSM 42 controls the division ratio of the MMD 34 in accordance with information in an N-bit control word $F_{ract}$ on input line 46 coupled to the input 48 of the DSM 42. For purposes of understanding in FIG. 1, the input control word $F_{ract}$ includes all the necessary information to be provided to the multimodulus frequency divider including any pre-dividers. Likewise, the multi-modulus frequency divider may take on different forms and implementations and for purposes of explanation in FIG. 1, the multi-modulus frequency divider produces the loop phase error signal $F_{comp}$ The clock signal of the DSM 42 is not shown in FIG. 1, however it can be $F_{ref}$, $F_{comp}$ or an even faster clock signal wherein the maximum clock frequency $F_{max}$ is the VCO output frequency $F_{out}$. As discussed further herein, it is preferable to use the $F_{comp}$ clock signal as the clock signal which insures the output signal of the DSM is correctly synchronized with the MMD. A drawback and disadvantage of the currently known delta-sigma modulator based fractional-N frequency synthesizer 10 is the generation of fractional spurious frequencies that are created by the periodicity of the signal at the output 44 of the DSM 42 when the input fractional control word $F_{ract}$ has too few "zeros" or "ones." The condition of too few "zeros" or "ones" occurs because all desired RF channels or VCO output frequencies must be selectable. If the desired channel is only one fractional channel different than or away from the integer channel, then the input word/code $F_{ract}$ to the DSM is "00000001" in binary format when the input word width to the DSM is 8 bits. This causes a large least significant bit (LSB) fractional offset spurious and its harmonics. Correspondingly, the input word/code $F_{ract}$ "11111110" also produces a large least significant bit (LSB) fractional offset. Similarly, if only the most significant bit (MSB) is high "10000000", then the MSB fractional spurious appears and output signal of the DSM does not have a good noise shape. Empirical measurements and observations of the fractional-N synthesizer show that at least 3 or 4 "zeros" or "ones" in the input code $F_{ract}$ results in good noise shaping features, because the DSM produces a sufficient number of different frequency components/terms. Although greatly improved, it still is not possible to avoid all bad channels, that is, it is not possible to avoid the generation of fractional spurious frequencies and as illustrated in the embodiments shown in FIGS. 2 to 5, a sine wave generator is added to overcome the problem of too few "zeros" or "ones" which cause a periodicity to the DSM output control signal and the generation of spurious frequency signals.

Figure 2:
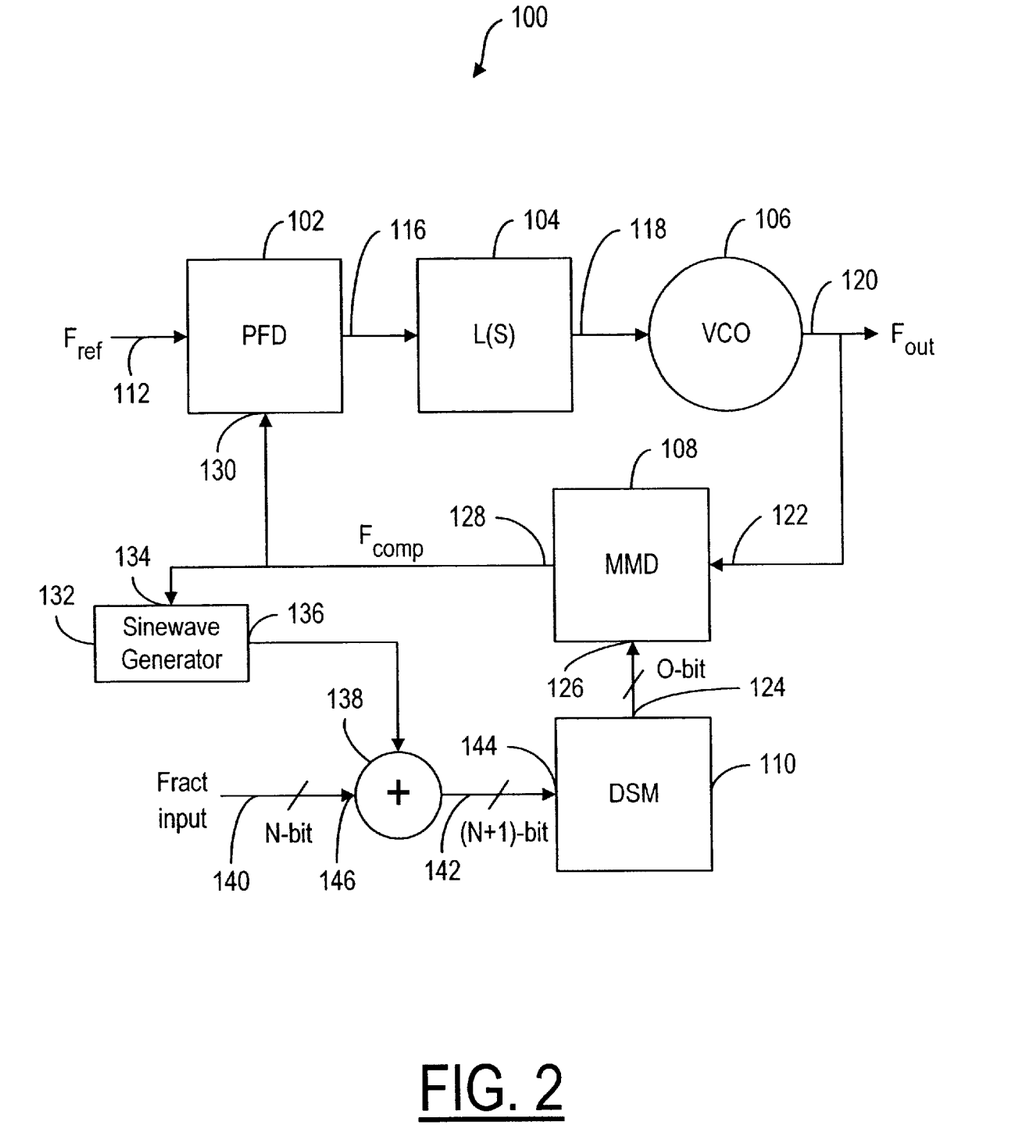
FIG. 2 is a schematic functional block diagram of a first embodiment of a delta-sigma fractional-N synthesizer of the present invention.

Turning now to FIG. 2, a schematic functional block diagram of a first embodiment of a delta-sigma modulator fractional-N phase locked loop frequency synthesizer of the invention is illustrated therein and generally designated 100. The delta-sigma fractional-N frequency synthesizer 100 comprises a phase frequency detector (PFD) 102, a loop filter 104, a voltage-controlled oscillator (VCO) 106 and a multi-modulus frequency divider (MMD) 108 in a feedback loop between the VCO output 120 and an input 130 of the PFD 102. The signal $F_{out}$ at the output 120 of the VCO 106 is coupled to the input 122 of the MMD 108. The output 128 of the MMD 108 is coupled to the input 130 of the PFD 102. The signal $F_{comp}$ at the input 130 to the PFD 14 is representative of the loop phase error, that is, the difference in phase between the frequency $F_{out}$ and the input frequency $F_{ref}$ as discussed above. The PFD 102 functions to measure the phase difference between the input frequency $F_{ref}$ and the VCO output frequency $F_{out}$ and adjusts (advances or retards) the phase of the VCO and thus the frequency $F_{out}$ produced by the VCO. The MMD 108 is also coupled to and controlled by a delta-sigma modulator (DSM) designated generally 110. The control output 124 of the DSM 110 is coupled to the control input 126 of the MMD 108. The VCO output frequency $F_{out}$ at the VCO output 120 is a fraction of the reference frequency $F_{ref}$ on the line 112 connected to the input of the PFD 102. The output 118 of the loop filter 104 is coupled to the input of the VCO 106. The output 116 of the PFD 102 is coupled to the input of the loop filter 104, which functionally operates as an integrating capacitor.

The output 128 of the MMD 108 is also coupled to the input 134 of a sine wave generator designated generally 132. The output 136 of the sine wave generator 132 is coupled to an adder 138. The fractional N-bit control word $F_{ract}$ on the lead 140 is coupled to the input 146 of the adder 138 wherein the fractional N-bit control word is added to the output signal of the sine wave generator 132 to produce a varying (N+1)-bit control word at the output 142 of the adder 138.

The output 142 of the adder 138 is coupled to the input 144 of the DSM 110. The input control signal to the delta-sigma modulator is "dithered" by adding a symmetric "average zero" signal produced by the sine wave generator to the fractional N-bit control word $F_{ract}$. The "dithered" input signal to the DSM 110 breaks the periodicity of the signal at the output 124 which is coupled to the input 126 of the MMD 108 to control the division ratio and eliminates the otherwise produced fractional spurious signals. As mentioned above, without dithering, the output of the DSM is too repetitive or periodic in cases where there are too few "zeros" or "ones". For example, in one fractional-N frequency synthesizer model with a third order DSM and a $F_{ract}$ input word in which only the MSB is "one" and the other remaining bits are "zero", the DSM produces only 4 different control values (0,2, -1,1), which repeat continually. Thus, the DSM cannot provide sufficient noise shaping without dithering the $F_{ract}$ input signal to the DSM. It also depends on a specific application as to which input bit combination produces the worst fractional spurious due to the periodicity of the DSM output.

Figure 3:
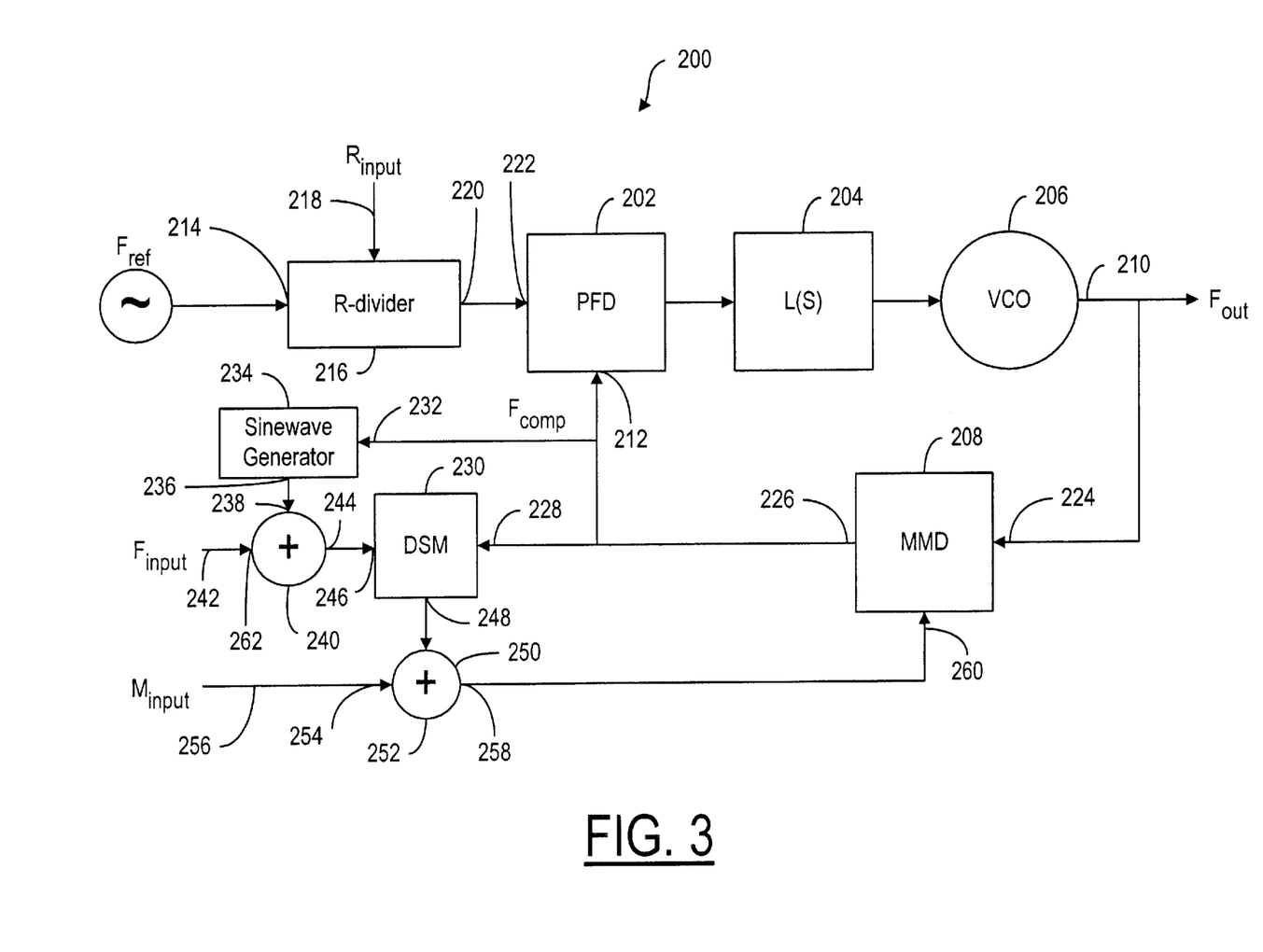
FIG. 3 is a schematic functional block diagram of an alternate embodiment of the delta-sigma fractional-N synthesizer of the present invention.

Turning now to FIG. 3, a delta-sigma fractional-N phase locked loop frequency synthesizer embodying the invention is illustrated therein and designated generally 200. The delta-sigma fractional-N synthesizer 200 comprises a phase frequency detector (PFD) 202, a loop filter 204, a voltage-controlled oscillator (VCO) 206 and a multi-modulus frequency divider (MMD) 208 in the feedback loop between the VCO output 210 and an input 212 of the PFD 202. A reference frequency $F_{ref}$ is coupled to the input 214 of an R-divider designated generally 216. An R control signal on the R-input 218 causes the R-divider to be loaded with the desired count to scale the frequency of $F_{ref}$. The function of the R-divider is to scale the reference frequency $F_{ref}$ to a lower frequency and is typically under the control of a digital signal processor (DSP) that provides the R-input signal. The R-divider allows use of the same phase locked loop PLL in different solutions, for example, a given used crystal oscillator may be changed without changing the desired channel spacing. Various different RF specifications or protocols (GSM, PDC, WCDMA) in the same wireless telephone may require a change to the value of the R-divider to achieve the desired frequency. It will be recognized by those skilled in the art that the highest comparison frequency generally provides the best performance of the PLL.

The output 220 of the R-divider 216 is coupled to one input 222 of the PFD 202. The frequency $F_{out}$ produced by the VCO 206 is a fraction of the input frequency $F_{ref}$ as input to the PFD 202 from the output 220 of the R-divider 216. The VCO output 210 is coupled to the input 224 of the MMD 208. The $F_{comp}$ signal from the output 226 of the MMD 208 is coupled to a clock input 228 of a DSM 230 and a clock signal input 232 of a sine wave generator 234 in addition to the input 212 to the PFD 202. The output 236 of the sine wave generator 234 is coupled to one input 238 of an adder 240 where the sine wave signal is combined with a fractional-N-bit control word $F_{input}$ on the lead 242 coupled to the input 262 of the adder 240 to produce a "dither" control signal at the output 244 of the adder 240.

The output 244 is coupled to the input 246 of the DSM 230. The DSM 230 produces a control signal at its output 248 which is coupled to the input 250 of an adder 252. An $M_{input}$ word on the lead 256 is coupled to the input 254 of the adder 252 where it is combined with the output of the DSM 230 to produce a multi-modulus control word at the adder output 258. The adder output 258 is coupled to the control input 260 to the MMD 208 to control the division ratio. The fractional input signal $F_{ract}$ on lead 46 in FIG. 1 and on lead 140 in FIG. 2 is divided into two separate control input signals $F_{input}$ and $M_{input}$ in FIG. 3 because the $F_{ract}$ input signal is only coupled to the input of the DSM in FIGS. 1 and 2. In many applications, M is an integer value and F is a fractional value. Finally, the output of the DSM is combined with the M input before the MMD. Note, that in FIG. 3, it is expected that the resultant of adder 240 never overflows the capacity of the input of the DSM and the amplitude of the sine wave generator (bit number) is less than the bit number of the $F_{input}$ signal.

The sine wave generator 234 produces a fixed frequency at its output 236 and is related to the comparison frequency $F_{comp}$ appearing at the sine wave generator input 232. The comparison frequency $F_{comp}$ can be divided by a factor in the range of 2 to a value Y. The value of Y depends on the loop filter used and the comparison frequency $F_{comp}$ to determine which sine frequency value is the best choice to achieve the needed performance. Normally, the highest possible frequency is the best choice because the generated frequency will be as far as possible outside the loop. If the sine wave frequency is for example, $F_{comp}/2$, then there are only two different values in the output of the sine wave generator, 1 and −1 which is not a sine wave signal. At least four values are needed to produce a sine wave. The loop filter is determinate of the maximum value for Y because the generated frequency should be filtered out. Based on empirical measurements and observations, it is apparent the best divider factors for the sine wave generator are: 4, 8, 16 or 32. Additionally, the amplitude of the sine wave signal can be varied, and it depends on the fractional input used as to how large an amplitude as a bit wide signal can be selected. The amplitude is a trade-off between the shaping feature and output amplitude of the sine wave signal after passing through the loop filter. It is generally not possible to predict or know exactly the correct amplitude level for a given application. Accordingly, it is preferable to implement a number of different amplitude levels which are controlled and selected by a DSP to achieve the desired performance. Of course, the best choice is to use an amplitude level as small as possible to produce the needed noise shaping feature.

Figure 4:
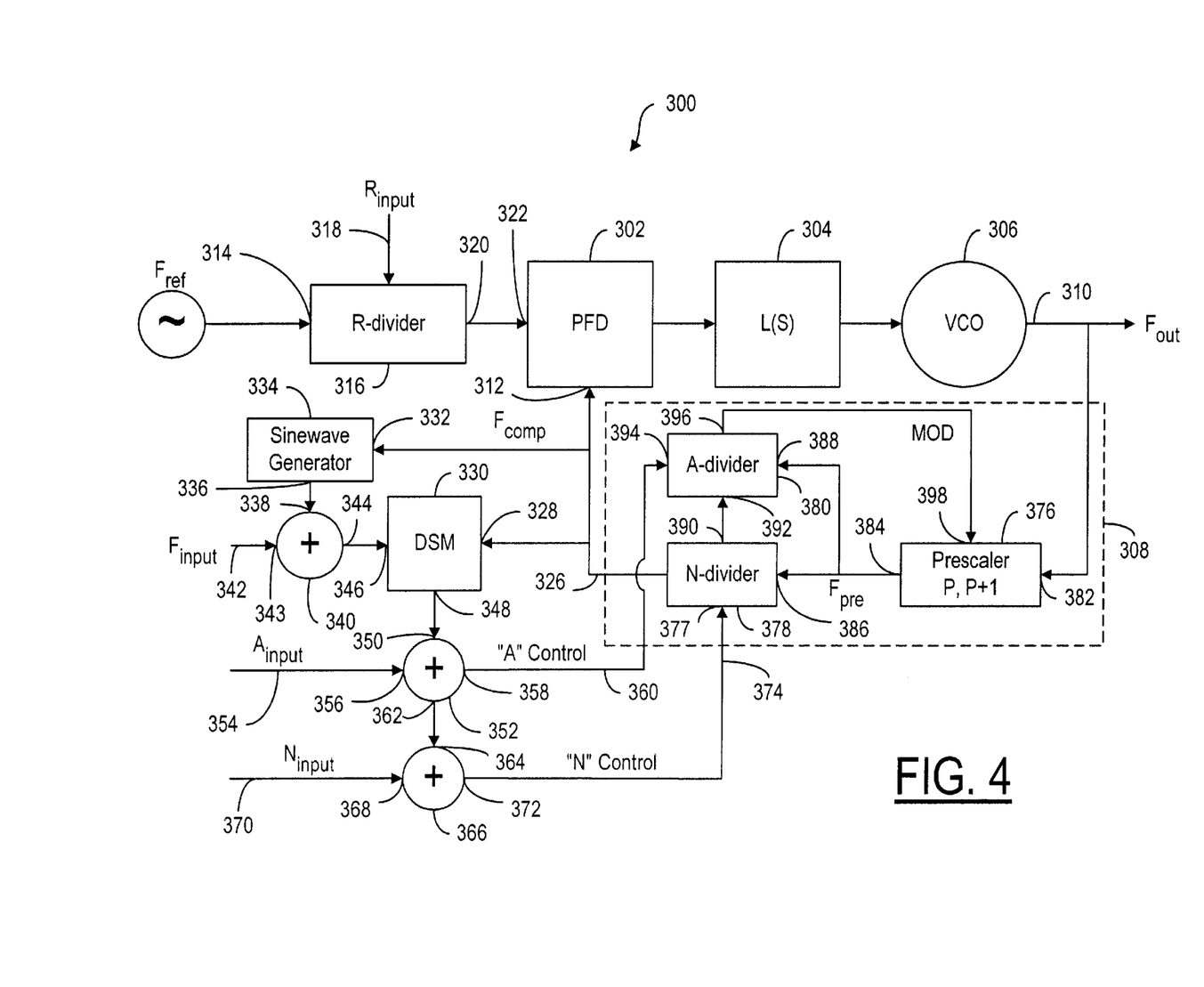
FIG. 4 is a schematic functional block diagram of a further alternate embodiment of the delta-sigma fractional-N synthesizer of the present invention.

Turning now to FIG. 4, a delta-sigma fractional-N phase locked loop frequency synthesizer embodying the invention is illustrated therein and designated generally 300. The delta-sigma fractional-N synthesizer 300 comprises a phase frequency detector (PFD) 302, a loop filter 304, a voltage-controlled oscillator (VCO) 306 and a dual-modulus frequency divider (DMD) shown in the dash line box 308 in a feedback loop between the VCO output 310 and an input 312 of the PFD 302. A reference frequency $F_{ref}$ is coupled to the input 314 of an R-divider designated generally 316. An R-control signal on the R-input 318 causes the R-divider to be loaded with the desired count to scale the frequency $F_{ref}$. The R-divider functions and operates as described above in connection with FIG. 3. The output 320 of the R-divider 316 is coupled to one input 322 of the PFD 302. The output frequency signal $F_{out}$ on lead 310 produced by the VCO 306 is a fraction of the input frequency $F_{ref}$ as input to the PFD 302 from the output 320 of the R-divider 316. The VCO output 310 is coupled to the input 382 of the DMD 308. The $F_{comp}$ signal from the output 326 of the DMD 308 is coupled to a clock input 328 of a delta-sigma modulator (DSM) 330 and a clock signal input 332 of a sine wave generator 334 in addition to the input 312 of the PFD 302.

The output 336 of the sine wave generator 334 is coupled to one input 338 of an adder 340 where the sine wave signal is combined with a fractional-N-bit control word $F_{input}$ on the lead 342 coupled to the input 343 of the adder 340 to produce an "average zero" dither control signal at the adder output 344. The output 344 is coupled to the input 346 of the DSM 330. The DSM 330 produces a control signal at its output 348 which is coupled to one input 350 of an adder 352. An $A_{input}$ word on the lead 354 is coupled to an input 356 of the adder 352 and is added to the "dithered" control signal from the DSM output 348 to produce an "A" control signal at the adder output 358 and the adder output 362. The output 358 from the adder 352 is coupled to the input 360 feeding the input 394 of the A-divider 380 of the DMD 308. The "A" control signal from the adder output 358 controls the A-divider/counter 380 which determines how many times the prescaler 376 counts using P+1 clock signal. The output 362 of the adder 352 is coupled to the input 364 of adder 366. An N-bit control word $N_{input}$ on the lead 370 is coupled to the adder input 368 and is combined with the output 362 of adder 352 to produce an "N" control signal at the output 372 of the adder 366. The "N" control signal is coupled to the input 374 which feeds the input 377 of the N-divider 378 of the DMD 308. The "N" control signal at the input 374 carries information that controls the switching of the division ratio of the DMD 308.

The DMD 308 comprises a prescaler 376, an N-divider 378 and an A-divider 380. The frequency $F_{out}$ at the VCO output 310 is coupled to the input 382 of the prescaler 376. The prescaler 376 is an integer divider controlled by the MOD signal presented at its input 398 from the output 396 of the A-divider 380 and divides by P or P+1 dependent on the value of the MOD signal. A scaled frequency $F_{pre}$ of the VCO frequency $F_{out}$ is generated at the output 384 of the prescaler 376 and is coupled to the input 386 of the N-divider 378 and to the input 388 of the A-divider 380 and functions as the clock signal to both dividers. The N-divider 378 generates a comparison frequency $F_{comp}$ at the DMD output 326 in accordance with the control word at its input 377 fed from the input 374 and the prescaler frequency output $F_{pre}$. The output 390 of the N-divider 378 is coupled to the input 392 of the A-divider 380 to apply a division function to the prescaler frequency $F_{pre}$ in accordance with the control word at the A-divider input 394. The A-divider 380 produces a MOD control signal at its output 396 which is fed back to the input 398 of the prescaler 376 to cause the prescaler to change its division ratio. The output 390 of the N-divider is a load signal or a reset/set signal to the A-divider 380. The output 390 is active during one $F_{pre}$ clock period each time the N-divider 378 is full. This means that the count of the A-counter/divider 380 is always less than or equal to the count of the N-divider 378. After the load signal the A-counter/divider 380 is set to zero and it counts until it reaches the value of the "A" control word at input 394. Another approach other than loading the A-counter/divider 380 with a count of zero, is to set the A-counter/divider 380 to a maximum value minus the control word value, for example, (15−6=11 for 4 bit A-counter and a control word value 6). In this case, the A-counter output signal is used directly as the MOD signal. When the A-divider full signal is zero, the prescaler 376 counts using the P+1 clock signal and otherwise it counts using the P clock signal.

Figure 5:
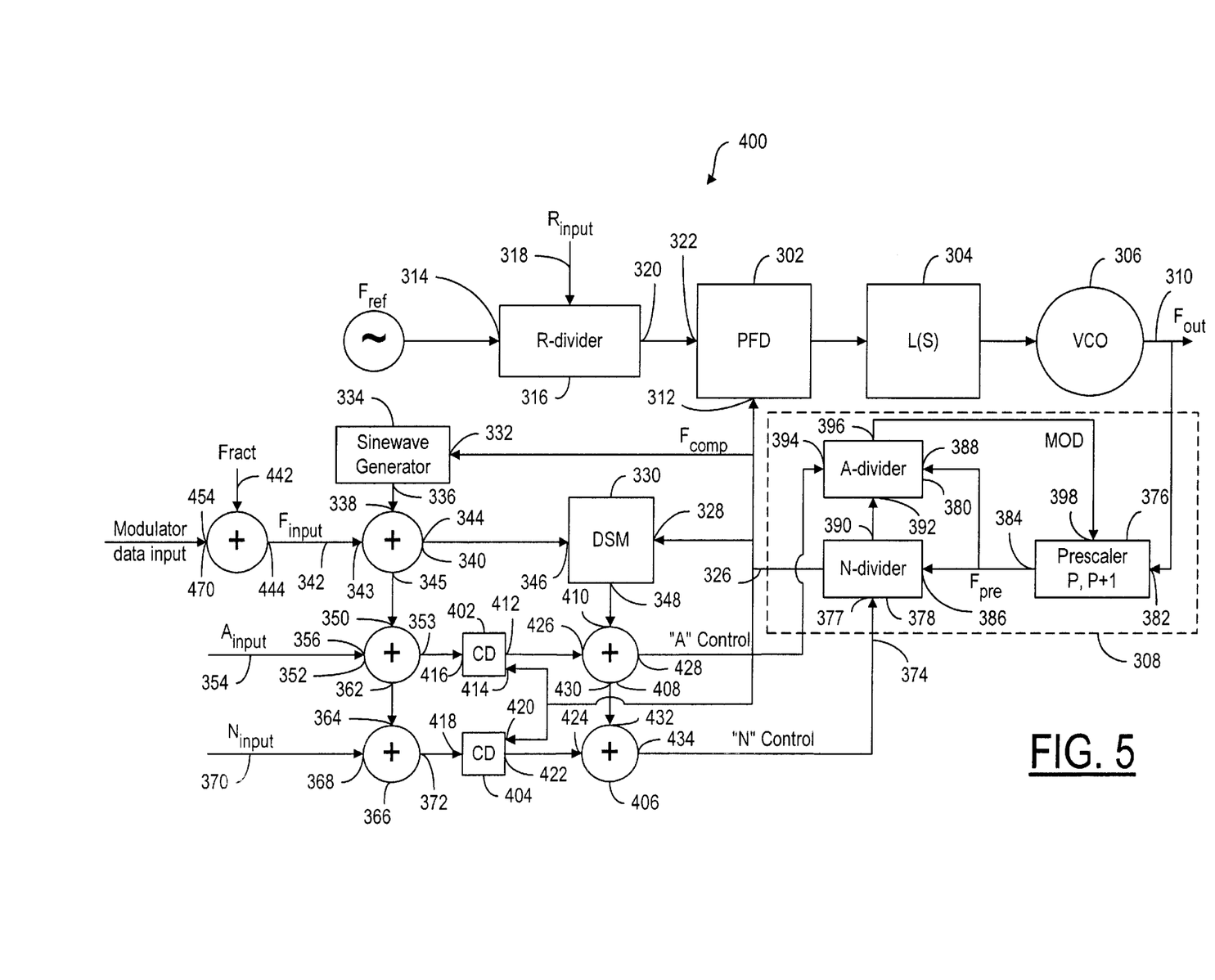
FIG. 5 is a schematic functional block diagram of a further alternate embodiment of the delta-sigma fractional-N synthesizer of the present invention.

Turning now to FIG. 5, a delta-sigma fractional-N phase locked loop frequency synthesizer embodying the invention is illustrated therein and designated generally 400. The delta-sigma fractional-N synthesizer 400 is particularly suited for use as an indirect delta-sigma fractional-N synthesizer or modulated fractional-N synthesizer, that is, the modulation is controlled by phase information. The delta-sigma fractional-N synthesizer 400 is similar to the embodiment illustrated in FIG. 4 and like reference numbers correspond to like components; however, in this case the $F_{input}$ signal on lead 342 is the output 444 of the adder 470 and is the sum of the $F_{ract}$ input signal coupled to the input 442 and the modulation data signal coupled to the input 454. The delta-sigma fractional-N synthesizer 400 is also preferred in instances where the amplitude of the sine wave signal is of a magnitude that exceeds the amplitude that can be input to the delta-sigma modulator. The delta-sigma fractional-N synthesizer 400 comprises a phase frequency detector (PFD) 302, a loop filter 304, a voltage-controlled oscillator (VCO) 306 and a DMD shown in the dash line box 308 in a feedback loop between the VCO output 310 and an input 312 of the PFD 302.

A reference frequency $F_{ref}$ is coupled to the input 314 of an R-divider designated generally 316. An R-control signal on the R-input 318 causes the R-divider to be loaded with the desired count to scale the frequency $F_{ref}$. The R-divider functions and operates as described above in connection with FIG. 3 and FIG. 4 above. The output 320 of the R-divider 316 is coupled to one input 322 of the PFD 302. The output frequency signal $F_{out}$ produced on lead 310 by the VCO 306 is a fraction of the input frequency $F_{ref}$ appearing at the input to the PFD 302 from the output 320 of the R-divider 316. The VCO output 310 is coupled to the input 382 of the DMD 308. The $F_{comp}$ signal from the output 326 of the DMD 308 is coupled to a clock input 328 of a delta-sigma modulator (DSM) 330, a clock input 332 of a sine wave generator 334, an input 414 of a first compensating delay means 402 and an input 420 of a second delay compensating means 404 in addition to the input 312 of the PFD 302. In this embodiment it is critical to avoid delays in the output signal (clock cycles) of the DSM otherwise phase errors would be introduced which would change the control information to the A-counter/divider and N-counter/divider. Accordingly, any delays of the DSM clock cycles must be compensated before input to the dual-modulus frequency divider. Any delays in the clock cycles of the DSM depend on the specific implementation of the DSM. It should be noted that the delay compensating means are also clocked by the $F_{comp}$ signal to maintain proper timing and may be implemented using registers or latches. A further possible implementation of the delay compensating means is a FIFO (first-in, first-out) structure using RAM cells and other clocked logic including the counter(s).

The output 336 of the sine wave generator 334 is coupled to one input 338 of an adder 340 where the sine wave signal is combined with a fractional N-bit control word $F_{input}$ on the lead 342 coupled to the input 343 of the adder 340 to produce an "average zero" dither control signal at the adder output 344. The output 344 is coupled to the input 346 of the DSM 330. The DSM 330 produces a control signal (clock cycles) at its output 348 which is coupled to one input 410 of an adder 408. The output 412 from the compensating delay means 402 is coupled to the input 426 of the adder 408 and the output 412 is added to the output 348 from the DSM 330.

An $A_{input}$ on the lead 354 is coupled to an input 356 of the adder 352 and is added to the sine wave $+F_{input}$ "dithered" signal coupled to its input 350 from the output 345 of the adder 340. The resultant sine wave $+F_{input} +A_{input}$ at the output 362 of the adder 352 is coupled to the input 364 of the adder 366. The output 353 of the adder 352 is coupled to the input 416 of the compensating delay means 402. An N-bit word $N_{input}$ on the lead 370 is coupled to the adder input 368 of adder 366 and is combined with the sine wave $+F_{input} +A_{input}$ output 362 from the adder 352. The resultant sine wave $+F_{input} +A_{input} +N_{input}$ output 372 from the adder 366 is connected to the input 418 of the compensating delay means 404. The output on lead 412 of the compensating delay means 402 is added in the adder 408 to the output 348 of the DSM to produce an "A" control signal at the output 428 which is input to the dual-modulus frequency divider 308 feeding the input 394 of the A-counter/divider. Another output 430 of the adder 408 is connected to an input 432 of an adder 406 where the signal at the output 430 is added to the signal at the output 422 from the compensating delay means 404 coupled to the input 424 of the adder 406. The adder 406 produces an "N" control signal at the output 434 which is coupled to the input 374 to the dual-modulus frequency divider 308 feeding the N-counter/divider 378. The adders 340, 352 and 366 coupled to the $F_{input}, A_{input}$ and $N_{input}$, respectively are used because the amplitude (weight or MSB) of the sine wave generator output signal may be same level as the N-input signal. An additional function of the adders 346, 352 and 366 is to handle overflow and underflow situations in the calculations, for example, if the $F_{input}$ is full 255 (8 bit), the $A_{input}$ is full 15 (4-bit), the $N_{input}$ is 23 (8 bit) and output of the sine wave generator is "0", then everything is okay. However, if the output of the sine wave generator is "1", then the output of the adder 340 is "0" and the output signal 345 goes "1", causing the adder 352 to overflow. Now the output of the adder 352 is "0" and the output signal 362 is "1", which is added together with the N input signal. Finally, the value of the output 372 of the adder 366 is 24.

As in FIG. 4, the DMD 308 in FIG. 5 comprises a prescaler 376, an N-divider 378 and an A-divider 380. The frequency $F_{out}$ at the VCO output 310 is coupled to the input 382 of the prescaler 376. The prescaler 376 is an integer divider controlled by the MOD signal presented at its input 398 from the output 396 of the A-divider 380 and divides by P or P+1 dependent on the value of the MOD signal. A scaled frequency $F_{pre}$ of the VCO frequency $F_{out}$ is generated at the output 384 of the prescaler 376 and is coupled to the input 386 of the N-divider 378 and to the input 388 of the A-divider 380 and functions as the clock signal to both dividers. The N-divider 378 generates a comparison frequency $F_{comp}$ at the dual-modulus divider output 326 in accordance with the control word at its input 377 fed from the input 374 and the prescaler frequency output $F_{pre}$. The output 390 of the N-divider 378 is coupled to the input 392 of the A-divider 380 to apply a division function to the prescaler frequency $F_{pre}$ in accordance with the control word at the A-divider input 394. The A-divider 380 produces a MOD control signal at its output 396 which is fed back to the input 398 of the prescaler 376 to cause it to change its division ratio.

Figure 6:
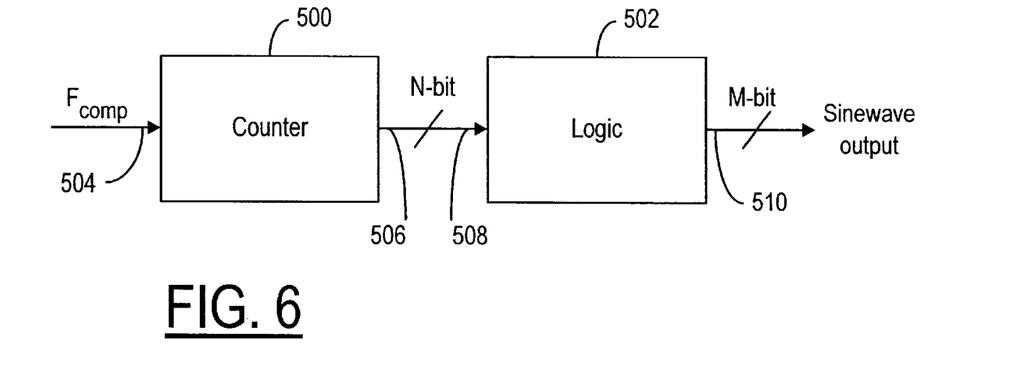
FIG. 6 is a functional block diagram of a sine wave signal generator using logic.
Figure 7:
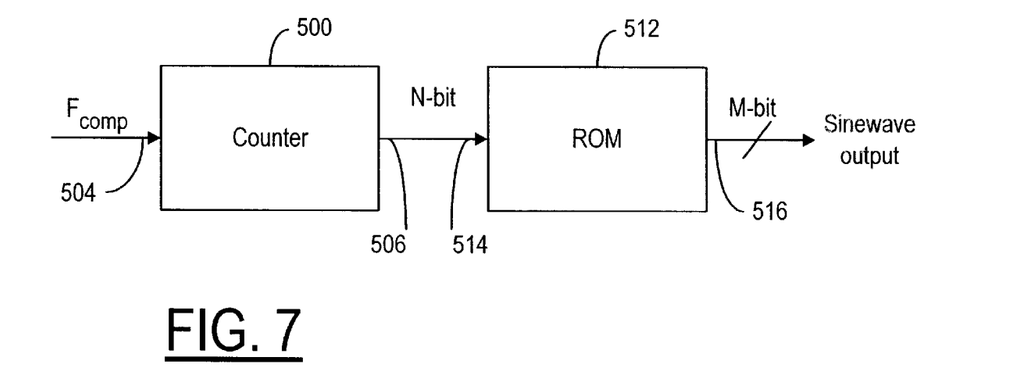
FIG. 7 is a functional block diagram of a sine wave signal generator using ROM.
Figure 8:
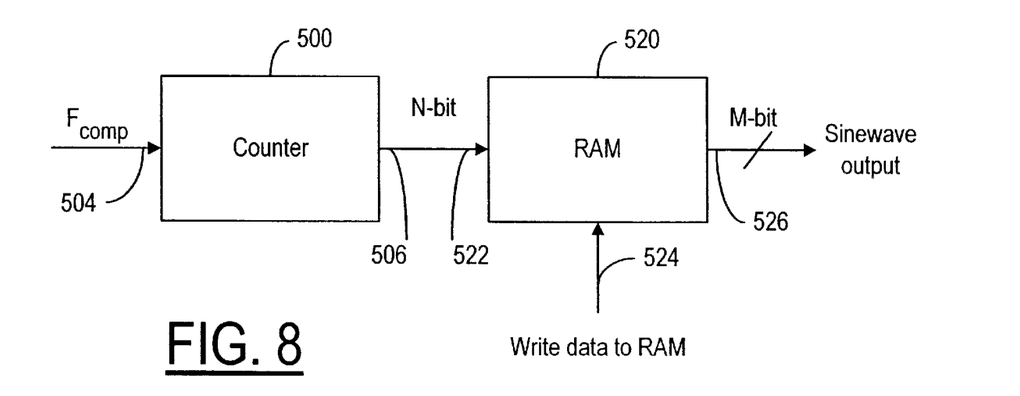
FIG. 8 is a functional block diagram of a sine wave signal generator using RAM.

The sine wave signal used to "dither" the input to the delta-sigma modulator may be generated using any of a number of different techniques and methods now known or future developed, some of which methods are illustrated, for example, in FIGS. 6, 7 and 8. In FIG. 6, the sine wave generator 334 comprises a counter 500 and a logic function means 502. The compensating frequency $F_{comp}$ is connected to the input 504 to the counter 500. The counter 500 produces an N-bit word at its output 506. The N-bit word is coupled to the input 508 of the logic function means 502 which, in response to the N-bit word input, produces an M-bit word sine wave signal at the output 510.

In FIG. 7, the sine wave generator comprises a counter 500 and a read-only memory (ROM) 512. The compensating frequency $F_{comp}$ is connected to the input 504 to the counter 500. The counter 500 produces an N-bit word at its output 506. The N-bit word is coupled to the input 514 of the ROM 512. An M-bit word is retrieved from an address location in the ROM corresponding to the N-bit word input and produces an M-bit word sine wave at the output 516.

In FIG. 8, the sine wave generator comprises a counter 500 and a random access memory (RAM) 520. The compensating frequency $F_{comp}$ is connected to the input 504 to the counter 500. The counter 500 produces an N-bit word at its output 506. The N-bit word is coupled to the input 522 of the RAM 520 and is written into an address location when the RAM is enabled by a write signal on the write enable input 524. An M-bit word is retrieved from the address location in the RAM corresponding to the N-bit word input and produces an M-bit word sine wave at the output 526.

What is claimed is:

1. A delta-sigma fractional-N frequency synthesizer comprising:
   a phase locked loop including a phase frequency detector, a loop filter, a voltage-controlled oscillator and a multi-modulus frequency divider in a feedback loop between the voltage-controlled oscillator output and an input of the phase frequency detector;
   a delta-sigma modulator having an input for receiving a fractional control word and an output coupled to the multi-modulus frequency divider for controlling the division ratio of the multi-modulus frequency divider in response to the input fractional control word;
   a generator for producing a signal in accordance with and related to a frequency compensation loop error signal from the multi-modulus frequency divider; and
   means for adding said generator signal output to a fractional input control word to produce a zero average dither fractional control word as the input to the delta-sigma modulator to generate a multi-modulus input control signal whereby the division ratio is changed without generation of fractional spurious frequencies.

2. The delta-sigma fractional-N frequency synthesizer as defined in claim 1, wherein the order of the delta-sigma modulator has an integer value in the range of Z to X, where Z is an integer value of at least 2 and X has an arbitrary integer value greater than Z.

3. The delta-sigma fractional-N frequency synthesizer as defined in claim 1, wherein said generator output signal frequency has a value in the range of $F_{comp}/Z$ to $F_{comp}/Y$, where Z is an integer value of at least 2 and the maximum value of Y is related to the loop filter and the frequency compensation loop error signal.

4. The delta-sigma fractional-N frequency synthesizer as defined in claim 1, wherein said generator signal output is an asymmetrical signal.

5. The delta-sigma fractional-N frequency synthesizer as defined in claim 1, wherein said generator signal output is a symmetrical signal.

6. The delta-sigma fractional-N frequency synthesizer as defined in claim 1, wherein said generator is a symmetrical sine wave generator.

7. The delta-sigma fractional-N frequency synthesizer as defined in claim 1, wherein said generator is an asymmetrical sine wave generator.

8. The delta-sigma fractional-N frequency synthesizer as defined in claim 3, wherein $F_{comp}/Z$ is equal to 4.

9. The delta-sigma fractional-N frequency synthesizer as defined in claim 3, wherein $F_{comp}/Z$ is equal to 8.

10. The delta-sigma fractional-N frequency synthesizer as defined in claim 3, wherein $F_{comp}/Z$ is equal to 16.

11. The delta-sigma fractional-N frequency synthesizer as defined in claim 3, wherein $F_{comp}/Z$ has an arbitrary integer value equal to or greater than 1.

12. The delta-sigma fractional-N frequency synthesizer as defined in claim 1, wherein said multi-modulus frequency divider is a dual-modulus frequency divider.

13. The delta-sigma fractional-N frequency synthesizer as defined in claim 12, further comprising said dual-modulus frequency divider including a prescaler coupled to the output of the voltage-controlled oscillator and an N-divider and A-divider coupled to the output of the prescaler, said prescaler having a division ratio control input coupled to said A-divider to switch the division ratio in response to said A-divider completing a predetermined count.

14. The delta-sigma fractional-N frequency synthesizer as defined in claim 1, wherein:
   said fractional input control word further comprises a separate $F_{input}$ control signal and an $M_{input}$ control signal;
   means for combining said $F_{input}$ control signal and said generator signal output to produce a delta-sigma modulator input control word, said delta-sigma modulator generating an output control word in response to said input control word; and
   means for combining said $M_{input}$ control signal and said delta-sigma modulator output control word to generate said multi-modulus frequency divider division ratio control.

15. The delta-sigma fractional-N frequency synthesizer as defined in claim 1, wherein said multi-modulus frequency divider further comprises a dual multi-modulus frequency divider.

16. The delta-sigma fractional-N frequency synthesizer as defined in claim 1, wherein:
   said fractional input control word further comprises a separate $F_{input}$ control signal and an $A_{input}$ control signal and an $N_{input}$ control signal;
   means for combining said $F_{input}$ control signal and said generator signal output to produce a delta-sigma modulator input control word, said delta-sigma modulator generating an output control word in response to said input control word;
   means for combining said $A_{input}$ control signal and said delta-sigma modulator output control word to generate a multi-modulus "A" control input signal; and
   means for combining said $N_{input}$ control signal and the result of the combined $A_{input}$ control signal and delta-sigma modulator output control word to generate a multi-modulus "N" control input signal.

17. A method for providing a desired synthesized fractional frequency without generating fractional spurious frequencies comprising the steps of:
   providing a fractional-N frequency synthesizer comprising a phase locked loop including a phase frequency detector, a loop filter, a voltage-controlled oscillator and a multi-modulus frequency divider in a feedback loop between the voltage-controlled oscillator output and an input of the phase frequency detector;

providing a delta-sigma modulator having an input for receiving a fractional control word and an output coupled to the multi-modulus frequency divider for controlling the division ratio of the multi-modulus frequency divider in response to the input fractional control word;

producing a signal in accordance with and related to a frequency compensation loop error signal from the multi-modulus frequency divider; and adding said signal to a fractional input control word to produce a zero average dither fractional control word as the input to the delta-sigma modulator to generate a multi-modulus input control signal whereby the division ratio is changed without generation of fractional spurious frequencies.

18. The method as defined in claim 17 wherein the step of providing a signal further comprises the step of providing a symmetrical sine wave signal.

19. The method as defined in claim 17 wherein the step of providing a signal further comprises the step of providing an asymmetrical sine wave signal.

20. A method of producing a synthesized fractional frequency without fractional spurious frequency generation comprising the steps of:

providing a reference frequency;

providing a phase locked loop voltage controlled oscillator;

generating a desired output frequency by controlling the division ratio of a multi-modulus frequency divider in a feedback path in the phase locked loop;

dithering the fractional input control signal to a delta sigma modulator using a sine wave generator; and controlling the multi-modulus division ratio with the output signal produced by the delta-sigma modulator.

* * * * *

UNITED STATES PATENT AND TRADEMARK OFFICE
CERTIFICATE OF CORRECTION

PATENT NO.    : 6,600,378 B1
DATED         : July 29, 2003
INVENTOR(S)   : Jari Petri Patana It is certified that error appears in the above-identified patent and that said Letters Patent is hereby corrected as shown below:

<u>Title page,</u>
Item [57], ABSTRACT,
Line 7, "dither" should read -- dithered --.

<u>Column 1,</u>
Line 54, "deltasigma" should read -- delta-sigma --.
Line 67, "multimodulus" should read -- multi-modulus --.

<u>Column 4,</u>
Line 33, after "...IM)" -- , -- should be inserted.
Line 63, "multimodulus" should read -- multi-modulus --.

<u>Column 5,</u>
Line 1, after "$F_{comp}$" -- . -- should be inserted.
Line 2, after "$F_{ref}$" -- , -- should be inserted.

<u>Column 7,</u>
Line 4, "trade-off" should be -- tradeoff --.

Signed and Sealed this

Twenty-third Day of September, 2003

JAMES E. ROGAN
*Director of the United States Patent and Trademark Office*